(12) United States Patent
Hsiao

(10) Patent No.: US 10,424,383 B1
(45) Date of Patent: Sep. 24, 2019

(54) DECODING METHOD AND STORAGE CONTROLLER

(71) Applicant: Shenzhen EpoStar Electronics Limited CO., Shenzhen (CN)

(72) Inventor: Yu-Hua Hsiao, Hsinchu County (TW)

(73) Assignee: Shenzhen EpoStar Electronics Limited CO., Shenzhen (CN)

(*) Notice: Subject to any disclaimer, the term of this patent is extended or adjusted under 35 U.S.C. 154(b) by 0 days.

(21) Appl. No.: 16/102,749

(22) Filed: Aug. 14, 2018

(30) Foreign Application Priority Data

Mar. 30, 2018 (TW) .............................. 107111392 A

(51) Int. Cl.
| G06F 3/00 | (2006.01) |
| G11C 16/26 | (2006.01) |
| G06F 3/06 | (2006.01) |
| G11C 11/56 | (2006.01) |
| G11C 16/10 | (2006.01) |
| G11C 16/04 | (2006.01) |

(52) U.S. Cl.
CPC ............ G11C 16/26 (2013.01); G06F 3/0604 (2013.01); G06F 3/0659 (2013.01); G06F 3/0679 (2013.01); G11C 11/5628 (2013.01); G11C 11/5642 (2013.01); G11C 11/5671 (2013.01); G11C 16/0483 (2013.01); G11C 16/10 (2013.01)

(58) Field of Classification Search
CPC .............................. G11C 16/26; G06F 3/0679
USPC ....................................................... 711/103
See application file for complete search history.

(56) References Cited

U.S. PATENT DOCUMENTS

| 6,049,498 A * | 4/2000 | Chen ...................... G11C 5/143 365/185.23 |
| 8,159,881 B2 | 4/2012 | Yang |
| 8,498,152 B2 | 7/2013 | Alrod et al. |
| 9,025,393 B2 | 5/2015 | Wu et al. |
| 2004/0042269 A1* | 3/2004 | Tamura ............... G11C 11/5628 365/185.12 |
| 2013/0003459 A1 | 1/2013 | Ulriksson et al. |

FOREIGN PATENT DOCUMENTS

| CN | 104616695 | 12/2017 |
| CN | 107527644 | 12/2017 |
| TW | 201501124 | 1/2015 |

OTHER PUBLICATIONS

"Office Action of Taiwan Counterpart Application", dated Oct. 19, 2018, p. 1-p. 3.

* cited by examiner

*Primary Examiner* — Jae U Yu

(74) *Attorney, Agent, or Firm* — JCIPRNET

(57) ABSTRACT

A decoding method and a storage controller for a rewritable non-volatile memory module are provided. The method includes: choosing a target word line among a plurality of word lines, wherein preset data is programmed into a plurality of target memory cells of the target word-line; identifying a plurality of preset bit values according to the preset data; respectively using different X read voltage sets to read the target memory cells to obtain X read bit value sets respectively corresponding to the X read voltage sets, and obtain X deviation amount summation sets by comparing the X read bit value sets and the preset bit values; and determining N−1 optimized read voltages of an optimized read voltage set according to the X deviation amount summation sets.

10 Claims, 5 Drawing Sheets

FIG. 4

| | | G1 | G2 | G3 | G4 | G5 | G6 | G7 | G8 | |
|---|---|---|---|---|---|---|---|---|---|---|
| Memory cell | L | 1 | 1 | 1 | 1 | 0 | 0 | 0 | 0 | Storage state (type of Gray code) |
| | M | 1 | 1 | 0 | 0 | 0 | 0 | 1 | 1 | |
| | U | 1 | 0 | 0 | 1 | 1 | 0 | 0 | 1 | |
| Direction of first deviation | | ↑ | ↑ | ↑ | ↑ | ↑ | ↑ | ↑ | ↑ | |
| NL1 | | --- | $C(1)_{G2G3}$ | --- | $C(1)_{G4G5}$ | --- | --- | --- | --- | |
| NM1 | | --- | --- | $C(1)_{G3G4}$ | --- | $C(1)_{G5G6}$ | --- | --- | --- | |
| NU1 | | $C(1)_{G1G2}$ | --- | --- | --- | --- | $C(1)_{G6G7}$ | $C(1)_{G7G8}$ | --- | |
| Direction of second deviation | | ↓ | ↓ | ↓ | ↓ | ↓ | ↓ | ↓ | ↓ | |
| NL2 | | --- | --- | $C(1)_{G3G2}$ | --- | $C(1)_{G5G4}$ | --- | --- | --- | |
| NM2 | | --- | $C(1)_{G2G1}$ | --- | $C(1)_{G4G3}$ | --- | $C(1)_{G6G5}$ | --- | --- | |
| NU2 | | --- | --- | --- | --- | --- | --- | $C(1)_{G7G6}$ | $C(1)_{G8G7}$ | |
| SNL=NL1+NL2 | | $S(1)_1$ | --- | $S(1)_3$ | --- | $S(1)_5$ | --- | $S(1)_7$ | --- | |
| SNM=NM1+NM2 | | --- | $S(1)_2$ | --- | $S(1)_4$ | --- | $S(1)_6$ | --- | --- | |
| SNU=NU1+NU2 | | $S(1)_1$ | --- | --- | --- | $S(1)_5$ | --- | $S(1)_7$ | --- | |

DECODING METHOD AND STORAGE CONTROLLER

CROSS-REFERENCE TO RELATED APPLICATION

This application claims the priority benefit of Taiwan application serial no. 107111392, filed on Mar. 30, 2018. The entirety of the above-mentioned patent application is hereby incorporated by reference herein and made a part of this specification.

BACKGROUND OF THE INVENTION

Field of the Invention

The invention relates to a decoding method, and particularly relates to a decoding method and a storage controller for a rewritable non-volatile memory module.

Description of Related Art

In general, when data is read from a rewritable non-volatile memory module, if a page reading failure does not occur, the system may read the data according to a default read voltage set or an optimal read voltage set used previously. When a read failure occurs, a system (storage system) may stop using the default read voltage set or the optimal voltage used previously and correspondingly adjust the read voltage set.

In other words, the value of the optimal read voltage set of the rewritable non-volatile memory module is not fixed. However, known processes for adjusting the read voltage set to obtain the optimal read voltage set are resource-consuming. For example, in the first conventional read voltage optimization process, the sizes of a plurality of different read voltages corresponding to different threshold voltage distributions are constantly adjusted (e.g., a read voltage corresponding to a threshold distribution interface in a read voltage set is adjusted, and rest of the read voltages in the read voltage set are fixed) to read the data where the page reading failure occurs in attempt to obtain an optimal data reading result and set the read voltage set corresponding to the optimal data reading result as an optimized read voltage set corresponding to the physical unit storing the data. Taking a TLC flash memory (where one memory cell stores three bit values) as an example, a read voltage set has a total of seven read voltages corresponding to different voltage intervals. According to the conventional process, six of the read voltages are fixed, and one of the read voltages is changed. If each read voltage requires X times of adjustment, and the results are obtained through reading to compare all the results and find out the optimal one, it requires $(2^3-1)*X=7*X$ read counts to obtain the optimal read voltage. Besides, verified data are required for such conventional process. In other words, the first conventional process requires a large amount of computing resources (e.g., adjusting the read voltage and verifying corresponding read data) and storage space (e.g., the space for storing preset data). Thus, decoding becomes less efficient.

Alternatively, in the second conventional process, a plurality of adjustment read voltage sets set in advance in the hardware specification of a memory module are adopted to try to read the data and thereby look for the optimal data reading result. Specifically, the read voltages in each of the adjustment read voltage sets cannot be set by the controller of the storage device, and the number of the adjustment read voltage sets is limited. In other words, based on the second conventional process, it may be possible to find out one of the adjustment read voltage sets by which the data is correctly read (i.e., successfully decoded). However, the adjustment read voltage set that is found may not be the optimal read voltage set that meets the current threshold voltage, such as the one found in the first conventional process. Besides, due to the fewer number of adjustment read voltage sets and the lower accuracy, there may be a circumstance where none of the adjustment read voltage sets reads the data correctly.

In other words, while the second conventional process is able to find out the read voltage set that renders correct data in a more efficient manner than the first conventional process, the chance of failure of the second conventional process is also higher than the chance of the first conventional process. In addition, the number of error bits in the read data may also be higher. Hence, the load for decoding is higher.

Thus, how to quickly and efficiently optimize the read voltage without the verified data/preset data to facilitate the reading efficiency and the corresponding decoding efficiency of the rewritable non-volatile memory module is now an issue to work on.

SUMMARY OF THE INVENTION

Exemplary embodiments of the invention provide a decoding method and a storage controller capable of quickly and efficiently obtaining an optimized read voltage set precisely corresponding to a target word line. Accordingly, data is read correctly from the target word line by using a plurality of optimized read voltages of the optimized read voltage set, and decoding can be carried out more efficiently.

An embodiment of the invention provides a decoding method for a storage device including a rewritable non-volatile memory module. The rewritable non-volatile memory module includes a plurality of word lines, each of the word lines includes a plurality of memory cells, each of the memory cells is programmed to store a bit value corresponding to one of a plurality of different Gray codes, a total number of the Gray codes is N, and N is a first predetermined positive integer greater than 2. The method includes the following. A target word line of the word lines is chosen, and preset data is programmed to a plurality of target memory cells of the target word line. A plurality of preset bit values stored in the target memory cells are identified according to the preset data. The target memory cells are read by using respectively different X read voltage sets to obtain X read bit value sets respectively corresponding to the X read voltage sets, and X deviation amount summation sets are obtained by comparing the X read bit value sets and the preset bit values. X is a second predetermined positive integer. The X read voltage sets are ordered based on a first predetermined order. A voltage difference between every pair of adjacent read voltage sets among the X read voltage sets is a first predetermined voltage difference. Each of the X read voltage sets has N−1 read voltages ordered based on a second predetermined order. In addition, each of the X deviation amount summation sets has N−1 deviation amount summations ordered based on the second predetermined order. An read bit value set of the X read bit value sets corresponds to an $i^{th}$ read voltage set of the X read voltage sets. An $i^{th}$ deviation amount summation set of the X deviation amount summation sets corresponds to the $i^{th}$ read voltage set of the X read voltage sets. Moreover, a $j^{th}$ deviation amount summation of the $i^{th}$ deviation amount summation set corresponds to a $j^{th}$ read voltage of the read voltage set. N−1 optimized read voltages of an optimized read voltage set are determined according to the X deviation amount summation sets.

An embodiment of the invention provides a storage controller. The storage controller controls a storage device including a rewritable non-volatile memory module. The storage controller includes a connection interface circuit, a memory interface control circuit, a read voltage management circuit unit, and a processor. The connection interface circuit is coupled to a host system. The memory interface control circuit is coupled to the rewritable non-volatile memory module. The rewritable non-volatile memory module includes a plurality of word lines. Each of the word lines includes a plurality of memory cells. Each of the memory cells is programmed to store a bit value corresponding to one of a plurality of different Gray codes. A total number of the Gray codes is N, and N is a first predetermined positive integer greater than 2. The processor chooses a target word line of the word lines and instructs the read voltage management circuit unit to perform a read voltage optimization operation corresponding to the target word line. Preset data is programmed to a plurality of target memory cells of the target word line. In the read voltage optimization operation, the read voltage management circuit unit identifies a plurality of preset bit values stored in the target memory cells according to the preset data. The read voltage management circuit unit further reads the target memory cells by using respectively different X read voltage sets to obtain X read bit value sets respectively corresponding to the X read voltage sets, and obtains X deviation amount summation sets by comparing the X read bit value sets and the preset bit values, wherein X is a second predetermined positive integer. The X read voltage sets are ordered based on a first predetermined order, and a voltage difference between every pair of adjacent read voltage sets among the X read voltage sets is a first predetermined voltage difference. In addition, each of the X read voltage sets has N−1 read voltages ordered based on a second predetermined order, and each of the X deviation amount summation sets has N−1 deviation amount summations ordered based on the second predetermined order. An $i^{th}$ read bit value set of the X read bit value sets corresponds to an $i^{th}$ read voltage set of the X read voltage sets. An $i^{th}$ deviation amount summation set of the X deviation amount summation sets corresponds to the $i^{th}$ read voltage set of the X read voltage sets. Moreover, a $j^{th}$ deviation amount summation of the $i^{th}$ deviation amount summation set corresponds to a $j^{th}$ read voltage of the N−1 read voltages of the read voltage set. The read voltage management circuit unit further determines N−1 optimized read voltages of an optimized read voltage set according to the X deviation amount summation sets.

Based on the above, in the decoding method and the storage controller according to the embodiments of the invention, the read voltage optimization operation corresponding to the target word line may be performed on the target word line by using the preset data stored in the target word line. In the read voltage optimization operation, the storage controller may calculate the deviation amount summation sets according to the read bit value sets obtained through reading the target word line by using the different read voltage sets, so as to determine the optimized read voltages in the optimized read voltage set corresponding to the target word line according to the deviation amount summation sets. Accordingly, the optimal read voltage set for reading the target word line can be found efficiently and quickly, so as to facilitate the accuracy of the read data and make the decoding for data reading more efficient.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a schematic diagram illustrating calculating deviation amount summations according to an embodiment of the invention.

DESCRIPTION OF EMBODIMENTS

In the present embodiment, a storage device includes a rewritable non-volatile memory module and a storage device controller (which is also referred to as a storage controller or a storage control circuit). Moreover, the storage device is used together with a host system, and the host system may write data into the storage device or read data from the storage device.

Figure 1:
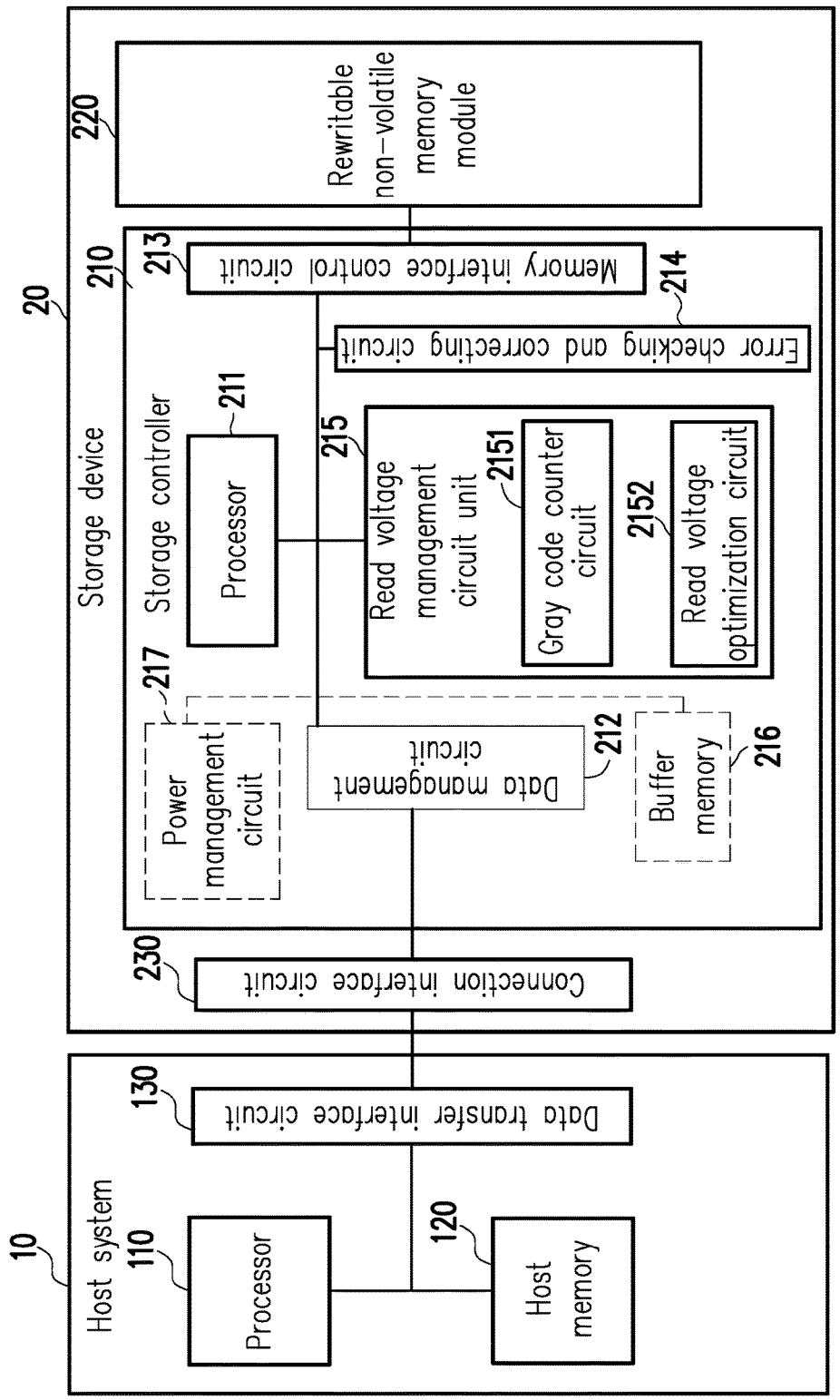
FIG. 1 is a schematic block diagram of a host system and a storage device according to an embodiment of the invention.

FIG. 1 is a schematic block diagram of a host system and a storage device according to an embodiment of the invention.

Referring to FIG. 1, the host system 10 includes a processor 110, a host memory 120 and a data transfer interface circuit 130. In the present embodiment, the data transfer interface circuit 130 is coupled (i.e., electrically connected to) the processor 110 and the host memory 120. In another embodiment, the processor 110, the host memory 120 and the data transfer interface circuit 130 are coupled to each other through a system bus.

The storage device 20 includes a storage controller 210, a rewritable non-volatile memory module 220 and a connection interface circuit 230. The storage controller 210 includes a processor 211, a data management circuit 212 and a memory interface control circuit 213.

In the present embodiment, the host system 10 is coupled to the storage device 20 through the data transfer interface circuit 130 and the connection interface circuit 230 of the storage device 20 to implement a data access operation. For example, the host system 10 may store data to the storage device 20 or read data from the storage device 20 through the data transfer interface circuit 130.

In the present embodiment, the processor 110, the host memory 120 and the data transfer interface circuit 130 may be disposed on a motherboard of the host system 10. The number of the data transfer interface circuit 130 may be one or plural. Through the data transfer interface circuit 130, the motherboard may be coupled to the storage device 20 through a wired or wireless manner. The storage device 20 is, for example, a flash drive, a memory card, a solid state disk (SSD) or a wireless memory storage device. The wireless memory storage device is, for example, a memory storage device based on various wireless communication techniques such as a near field communication (NFC) memory storage device, a WiFi memory storage device, a Bluetooth memory storage device or a low power consumption Bluetooth memory storage device (for example, iBeacon), etc. Moreover, the motherboard may also be coupled to a global positioning system (GPS) module, a network interface card, a wireless transmission device, or various I/O devices such as a keyboard, a screen, a mouse, a loudspeaker, etc., through the system bus.

In the present embodiment, the data transfer interface circuit 130 and the connection interface circuit 230 are interface circuits compatible to a peripheral component interconnect express (PCI express) standard. Moreover, the data transfer interface circuit 130 and the connection interface circuit 230 implement data transmission therebetween by using a non-volatile memory express (NVMe) communication protocol.

However, it should be noted that the invention is not limited thereto, and the data transfer interface circuit 130 and the connection interface circuit 230 may also be compliant with a parallel advanced technology attachment (PATA) standard, an institute of electrical and electronics engineers (IEEE) 1394 standard, a serial advanced technology attachment (SATA) standard, a universal serial bus (USB) standard, a SD interface standard, an ultra high speed-I (UHS-I) interface standard, an ultra high speed-II (UHS-II) interface standard, a memory stick (MS) interface standard, a multi-chip package interface standard, a multi media card (MMC) interface standard, an eMMC interface standard, a universal flash storage (UFS) interface standard, an eMCP interface standard, a CF interface standard, an integrated device electronics (IDE) standard or other suitable standards. Moreover, in another embodiment, the connection interface circuit 230 and the storage controller 210 may be packaged in one chip, or the connection interface circuit 230 is disposed outside a chip containing the storage controller 210.

In the present embodiment, the host memory 120 is used for temporarily storing a command or data executed by the processor 110. For example, in the present exemplary embodiment, the host memory 120 may be a dynamic random access memory (DRAM), a static random access memory (SRAM), etc. However, it should be noted that the invention is not limited thereto, and the host memory 120 may also be other suitable memory.

The storage controller 210 is used for executing a plurality of logical gates or control commands implemented in a hardware form or firmware form, and performing data writing, reading, and erasing operations on the rewritable non-volatile memory module 220 according to commands of the host system 10.

To be specific, the processor 211 of the storage controller 210 is hardware having computation capability, and is used for controlling a whole operation of the storage controller 210. Specifically, the processor 211 has a plurality of control commands, and when the storage device 200 operates, the control commands are executed for the data writing, reading and erasing operations.

It should be noted that in the present embodiment, the processor 110 and the processor 211 are, for example, central processing units (CPU), micro-processors or other programmable microprocessors, digital signal processors (DSP), programmable controllers, application specific integrated circuits (ASIC), programmable logic devices (PLD) or other similar circuit devices, which are not limited by the invention.

In an embodiment, the storage controller 210 further has a read-only memory (not shown) and a random access memory (not shown). Particularly, the read-only memory has a boot code, and when the storage controller 210 is enabled, the processor 211 firstly executes the boot code to load the control commands stored in the rewritable non-volatile memory module 220 to the random access memory of the storage controller 210. Afterwards, the processor 211 may execute the control commands to perform the data writing, reading and erasing operations. In another embodiment, the control commands of the processor 211 may also be stored in a specific area of the rewritable non-volatile memory module 220 (for example, a physical storage unit in the rewritable non-volatile memory module 220 used for storing system data) in form of program code.

In the present embodiment, as described above, the storage controller 210 further includes the data management circuit 212 and the memory interface control circuit 213. It should be noted that the operations executed by the components of the storage controller 210 may also be regarded as operations executed by the storage controller 210.

The data management circuit 212 is coupled to the processor 211, the memory interface control circuit 213 and the connection interface circuit 230. The data management circuit 212 is used for receiving instructions of the processor 211 to implement data transfer. For example, data is read from the host system 10 (for example, the host memory 120) through the connection interface circuit 230, and the read data is written into the rewritable non-volatile memory module 220 through the memory interface control circuit 213 (for example, the writing operation is performed according to a writing command coming from the host system 10). For another example, data may be read from one or more physical units of the rewritable non-volatile memory module 220 (the data may be read from one or more memory cells of the one or more physical units) through the memory interface control circuit 213, and the read data is written to the host system 10 (for example, the host memory 120) through the connection interface circuit 230 (for example, the reading operation is performed according to a reading command coming from the host system 10). In another embodiment, the data management circuit 212 may also be integrated into the processor 211.

The memory interface control circuit 213 receives an instruction of the processor 211, and performs the writing (also referred to as programming) operation, reading operation or erasing operation to the rewritable non-volatile memory module 220 in collaboration with the data management circuit 212.

For example, the processor 211 may execute a writing command sequence to instruct the memory interface control circuit 213 to write data to the rewritable non-volatile memory module 220. The processor 211 may execute a reading command sequence to instruct the memory interface control circuit 213 to read data from one or more physical units (also referred to as target physical units), corresponding to the reading command, of the rewritable non-volatile memory module 220. The processor 211 may execute an erasing command sequence to instruct the memory interface control circuit 213 to perform an erasing operation to the rewritable non-volatile memory module 220. The writing command sequence, the reading command sequence and the erasing command sequence may respectively include one or more program codes or command codes and instruct to perform the corresponding writing, reading and erasing operation to the rewritable non-volatile memory module 220. In an embodiment, the processor 211 may also send other types of the command sequence to the memory interface control circuit 213 to execute the corresponding operation to the rewritable non-volatile memory module 220.

Moreover, the data to be written into the rewritable non-volatile memory module 220 is converted into a format that is acceptable to the rewritable non-volatile memory module 220 by the memory interface control circuit 213. To be specific, if the processor 211 is about to access the rewritable non-volatile memory module 220, the processor 211 may send the corresponding command sequences to the memory interface control circuit 213 to instruct the memory interface control circuit 213 to execute the corresponding operations. For example, the command sequences include the writing command sequence instructing to write data, the reading command sequence instructing to read data, the erasing command sequence instructing to erase data, and corresponding command sequences instructing various memory operations (for example, to change a plurality of default read voltage values of a read voltage set or execute a garbage collection procedure, etc.). These command sequences may include one or more signals, or data on a bus. These signals or data may include command codes or program codes. For example, the reading command sequence may include information of reading identification codes, memory addresses, etc.

The rewritable non-volatile memory module 220 is coupled to the storage controller 210 (the memory interface control circuit 213) and stores data written by the host system 10. The rewritable non-volatile memory module 220 may be a single level cell (SLC) NAND flash memory module (i.e., a flash memory module where one memory cell may store 1 bit), a multi level cell (MLC) NAND flash memory module (i.e., a flash memory module where one memory cell may store 2 bits), a triple level cell (TLC) NAND flash memory module (i.e., a flash memory module where one memory cell may store 3 bits), a quadruple level cell (QLC) NAND flash memory module (i.e., a flash memory module where one memory cell stores four bits), a 3D NAND flash memory module or a vertical NAND flash memory module, etc, or other memory modules having the same characteristics. The memory cells in the rewritable non-volatile memory module 220 are arranged in an array.

In the present embodiment, the rewritable non-volatile memory module 220 has a plurality of word lines, and each of the word lines includes a plurality of memory cells. The memory cells on a same word line may construct one or more physical programming units (physical pages). In addition, the physical programming units may form a physical unit (a physical block or a physical erasing unit). The present embodiment takes the TLC NAND flash memory module as an example. In other words, in the following embodiment, a memory cell that may store three bit values may serve as a physical programming unit (i.e., in each programming operation, a programming voltage is applied to one physical programming unit after another to program data). In addition, each of the respective memory cells may be divided into a lower physical page, a middle physical page, and an upper physical page, each storing one bit value.

In the embodiment, the memory cell is the smallest unit for data writing (programming). The physical unit is the smallest unit for erasing. In other words, each physical unit contains the minimum number of memory cells to be erased together. Each physical unit has a plurality of memory cells.

It should be noted that, in the embodiment, system data recording information of a physical unit may be recorded in one or more memory cells in the physical unit or be recorded in one or more memory cells of a specific physical unit recording all system data in a system area. In the embodiment, the system data corresponding the physical unit includes information such as a program erase cycle (PEC), a data retention timestamp (DRP), a read counter value, etc., of the physical unit. More specifically, every time when the processor 211 performs the erasing operation to a physical unit, the processor 211 may add "1" to the PEC value of the corresponding physical unit when the erasing operation is completed. For example, the PEC value may add up from "0" along with each erasing operation. In other words, the program erase cycle value reflects the sum of times that the corresponding physical unit is erased. The data retention timestamp is used for instructing the time for which data is stored in the corresponding physical unit. Sizes of the timestamps (e.g., value differences) may reflect a temporal sequence. The invention does not intend to limit a detailed format of the timestamp. Every time when the writing operation is performed to the physical unit, the processor 211 may update the data retention timestamp of the physical unit to be the time at which the physical unit performs the writing operation. In other words, the data retention timestamp corresponding to a physical unit is used for indicating the time at which the latest writing operation is performed to the physical unit (e.g., local time when the latest writing operation is completed). The writing operation includes, for example, programming data to one or more memory cells of the physical unit, or, for example, programming data to another type of physical address of the physical unit. Then, the processor 211 may calculate how long the data in the physical unit has been stored since the previous writing operation according to the data retention timestamp. The read counter value serves to calculate the number of times that the corresponding physical unit is read, and the read counter value is reset when the corresponding physical unit is erased.

In the following embodiment, an example where one physical block serves as one physical unit is described. However, in another embodiment, one physical unit may also be formed by an arbitrary number of memory cells, depending on the practical needs. Besides, it should be understood that when the processor 211 groups the memory cells (or physical units) in the rewritable non-volatile memory module 220 to perform a corresponding management operation, the memory cells (or physical units) are logically grouped, while the physical positions of the memory cells remain the same.

For example, in the embodiment, the processor 211 may group a plurality of physical units into a plurality of physical unit groups according to statistical values of the physical units of the rewritable non-volatile memory module 220. The statistical value includes one of the program erase cycle, the data retention timestamp (also referred to as retention value) and the read counter value or a combination thereof. Physical units grouped into the same physical unit group may share similar physical properties. The processor 211 may read data from the physical units grouped into the same physical unit group according to the same read voltage set. For example, the same read voltage set is adopted to issue the read command sequence to perform the read operation to the physical units of the same physical unit group.

In other embodiments, the processor 211 may group the word lines of the rewritable non-volatile memory module 220 into a plurality of word line groups according to statistical values of the word lines (the processor 211 may calculate/sort the statistical values of the respective word lines), and the word lines grouped into the same word line group may have similar physical properties and thus can be read with the same read voltage set (i.e., the corresponding optimized read voltages) as in the previous embodiment. It should be noted that, in order to perform the read voltage optimization operation corresponding to each of the word lines (instead of each of the physical units) to each of the word lines, the following embodiment describes the read voltage optimization operation for each of the word lines and a read voltage optimization method for the operation. For an embodiment having multiple physical unit groups, the processor 211 may choose a word line of a physical unit from each of the physical unit groups to perform the read voltage optimization operation, or choose a physical unit from each of the physical unit groups to perform the read voltage optimization operation.

The storage controller 210 may assign a plurality of logical units to the rewritable non-volatile memory module 220. The host system 10 may access user data stored in the physical units through the assigned logical units. Here, each logical unit may be formed by one or more logical addresses. For example, the logical unit may be a logical block, a logical page, or a logical sector. Each logical unit may be mapped to one or more physical units. In addition, the logical unit may be one or more physical addresses, one or more physical sectors, one or more physical programming units, or one or more physical erasing units. In the embodiment, the logical unit is a logical block, and a logical sub-unit is a logical page. Each logical unit has a plurality of logical sub-units.

Besides, the storage controller 210 may build a logical to physical address mapping table and a physical to logical address mapping table to record the mapping relations between the logical units (e.g., logical blocks, logical pages, or logical sectors) assigned to the rewritable non-volatile memory module 220 and the physical units (e.g., physical erasing units, physical programming units, or physical sectors). In other words, the storage controller 210 may look for a physical unit mapped to a logical unit according to the logical to physical address mapping table, and the storage controller 210 may look up a logical unit mapped to a physical unit according to the physical to logical address mapping table. However, the technical concepts concerning mapping between the logical units and physical units are common technical means familiar to people having ordinary skills in the art. Thus, details in this regard will not be further described in the following.

In the embodiment, an error checking and correcting circuit 214 is coupled to the processor 211 and used for performing an error checking and correction operation to ensure the accuracy of data. Specifically, when the processor 211 receives a writing command from the host system 10, the error checking and correcting circuit 214 may generate a corresponding error correcting code (ECC) and/or error detecting code (EDC). In addition, the processor 211 may write the data and the corresponding ECC and/or EDC to the rewritable non-volatile memory module 220. Afterwards, when reading data from the rewritable non-volatile memory module 220, the processor 211 may also read the ECC or EDC corresponding to the data, and the error checking and correcting circuit 214 may perform the error checking and correcting operation to the read data according to the ECC and/or EDC. Moreover, after the error checking and correcting operation, if the read data is successfully decoded, the error checking and correcting circuit 214 may return an error bit value to the processor 211.

In an embodiment, the storage controller 210 may further include a buffer memory 216 and a power management circuit 217. The buffer memory is coupled to the processor 211 and used for temporarily storing data and commands from the host system 10, data from the rewritable non-volatile memory module 220, or other system data used for managing the storage device 20. Accordingly, the processor 211 may quickly access the data, the command, or the system data from the buffer memory 216. The power management circuit 217 is coupled to the processor 211 and used for controlling power of the storage device 20.

In the present embodiment, a read voltage management circuit unit 215 includes a deviation amount counter circuit 2151 and a read voltage optimization circuit 2152. The read voltage management circuit unit 215 is used for managing read voltages of the word lines. More specifically, the processor 211 may choose a word line (also referred to as a target word line) of the word lines of the physical units of the rewritable non-volatile memory module 220 at a specific time point, and instruct the read voltage management circuit unit 215 to perform the read voltage optimization operation to the target word line. For example, the processor 211 may choose the target word line from the word lines to perform the read voltage optimization operation when: (1) the storage device 20 is idling (i.e., the storage device 20 is idling for over a predetermined threshold of time); (2) the storage device is turned on; or (3) when the number of error bits in data read from a word line exceeds an error bit threshold. Specifically, the processor 211 may choose a word line from a word line group whose physical state is less preferable (e.g., a word line group having more program erase cycles, a greater read counter value, a longer retention time, or a greater number of error bits) as the target word line according to one of the statistical values and error bit numbers of all the word line groups or a combination thereof. Besides, the processor 211 may also choose the target word line according to the number of error bits returned by the error checking and correcting circuit 214. Specifically, when the number of error bits of data read from a word line exceeds an error bit threshold, that word line may be set as the target word line. It should be noted that the chosen target word line already stores data. In other words, data is already programmed in the target word line. Besides, if the read voltage optimization operation for the target word line is completed, the read voltage management circuit unit 215 may record a (optimized) read voltage set corresponding to the target word line.

In an embodiment, the processor 211 may also randomly choose the target word line to perform the read voltage optimization operation. In another embodiment, the processor 211 may also perform the read voltage optimization operation to each of the word lines. Accordingly, through the read voltage optimization operation, decoding may become more efficient.

In the following, details concerning how the read voltage management circuit unit 215 performs the read voltage optimization operation and the functions of the deviation amount counter circuit 2151 and the read voltage optimization circuit 2152 are described with reference to the accompany drawings.

Figure 2:
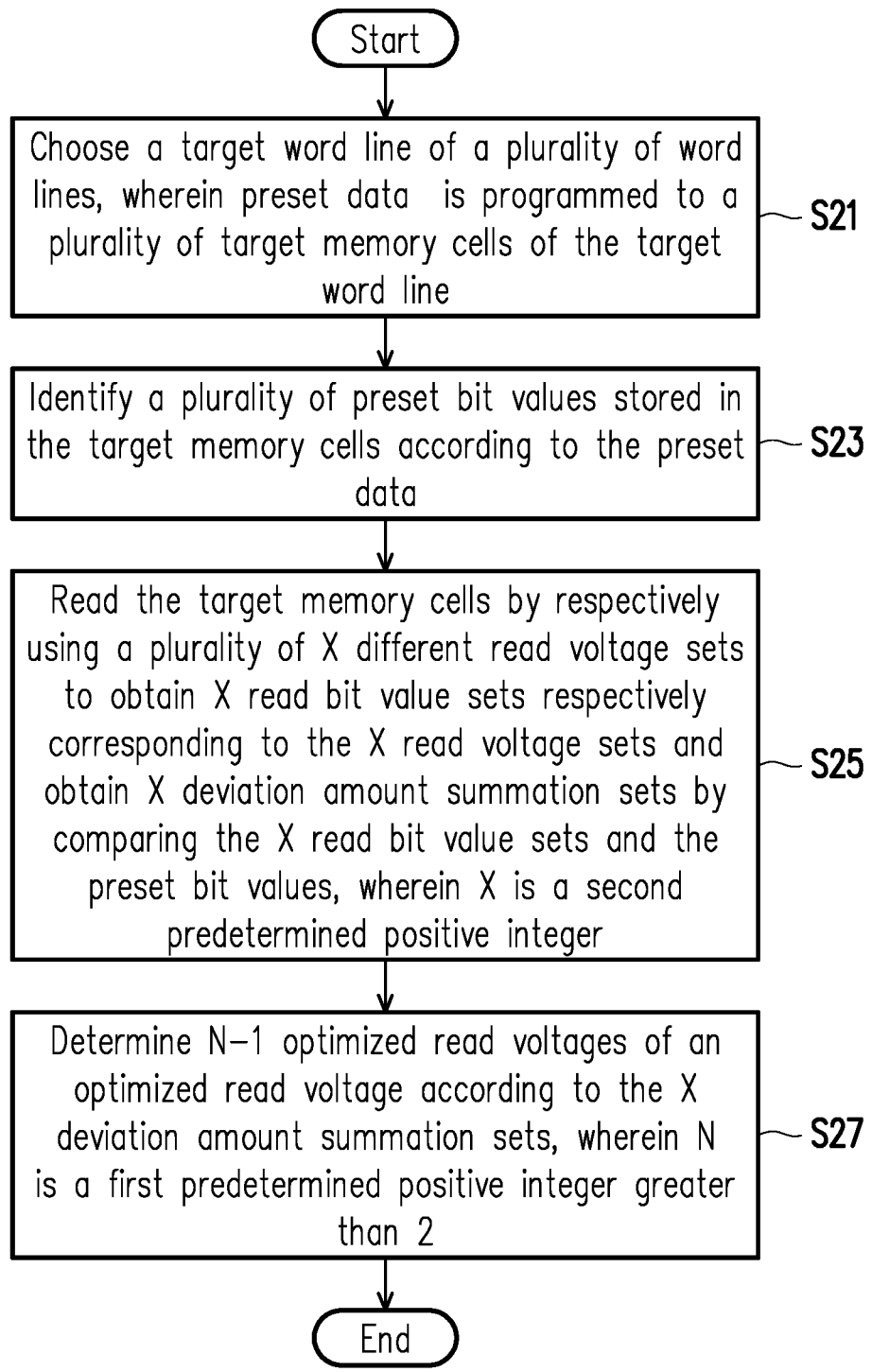
FIG. 2 is a flowchart illustrating a decoding method according to an embodiment of the invention.

FIG. 2 is a flowchart illustrating a decoding method according to an embodiment of the invention. Referring to FIGS. 1 and 2 at the same time, at Step S21, the processor 211 chooses the target word line among the word lines, and preset data is already programmed to a plurality of target memory cells of the target word line.

Assuming that the processor 211 currently performs the read voltage optimization operation to one (also referred to as a target word line group) of the word line groups, the processor 211 may firstly choose the target word line to which the read voltage optimization operation is performed. The target word line may be chosen from the word lines of the target word line group according to a predetermined selection condition. The predetermined selection condition includes: (1) the target word line having a statistical value close to an average of the statistical values of all the word lines of the word line group to which the target word line belongs; (2) the target word line having the number of error bits that is the minimum among all the word lines of the word line group to which the target word line belongs; or (3) a word line being randomly chosen as the target word line. The target word line stores the preset data.

In the embodiment, the preset data is stored in the target word line. Specifically, each memory cell of each word line is programmed to store a bit value corresponding to one of a plurality of different Gray codes. The total number of the Gray codes is N, and N is a first predetermined positive integer greater than 2. In other words, the preset data stored in the memory cells of the target word line may have bit values respectively corresponding to different Gray codes (also referred to as storage states).

At Step S23, the read voltage management circuit unit 215 (or the deviation amount counter circuit 2151) may identify a plurality of preset bit values stored in the target memory cells according to the preset data. Specifically, the preset data has the preset bit values. The preset bit values may include the different (patterns of) storage states (also referred to as Gray codes) that each of all the memory cells of the rewritable non-volatile memory module 220 may have. In the following, details of the Gray codes are described with reference to FIG. 3.

Figure 3:
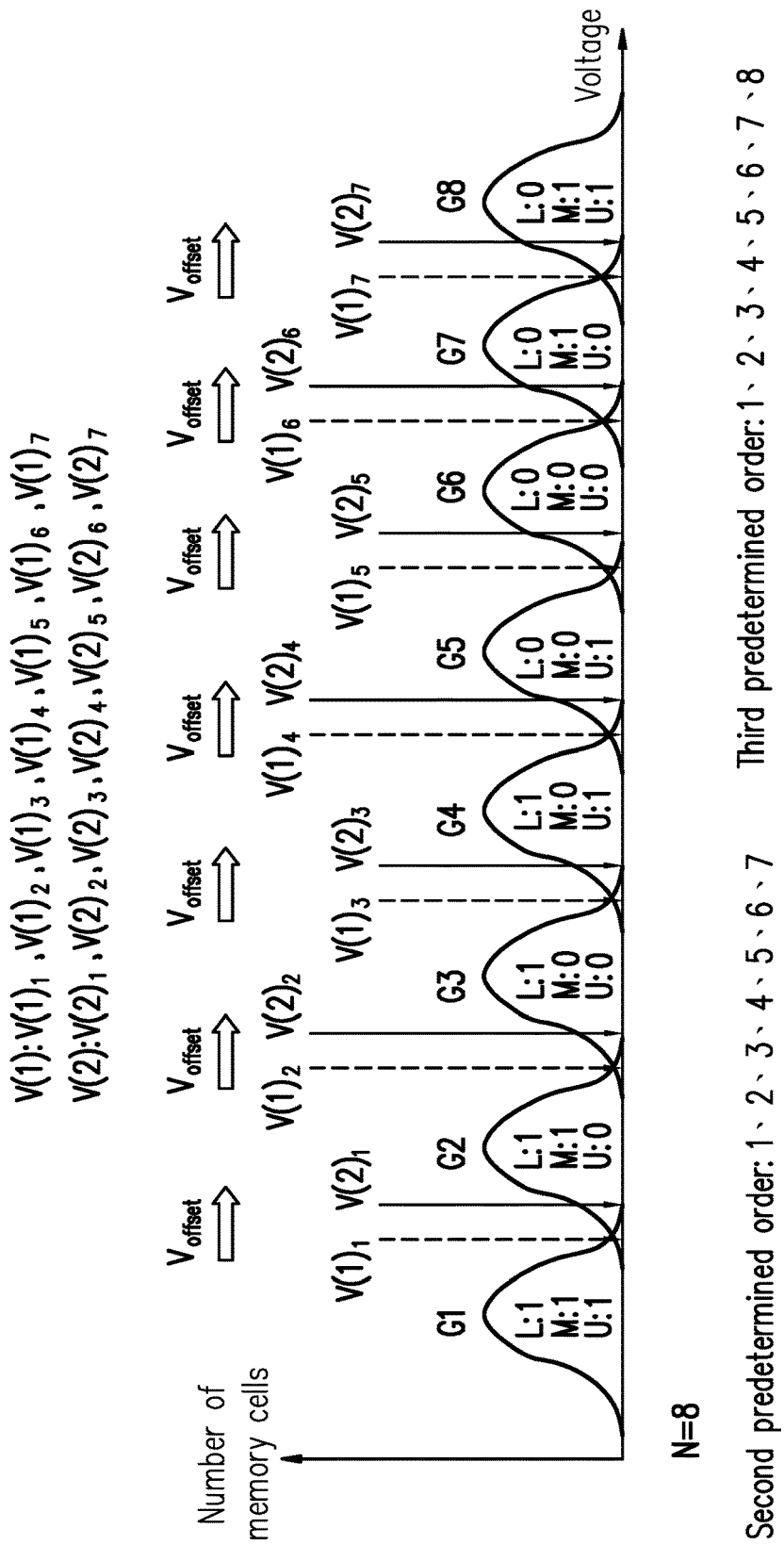
FIG. 3 is a schematic diagram illustrating two different read voltage sets and voltage differences therebetween according to an embodiment of the invention.

FIG. 3 is a schematic diagram illustrating two different read voltage sets and voltage differences therebetween according to an embodiment of the invention. Referring to FIG. 3, the embodiment is described with an example of the TLC NAND flash memory module, and N is 8 (i.e., $2^3$). Each memory cell of the TLC NAND flash memory module has three physical pages to respectively store bit data. Each memory cell includes a lower physical page (L), a middle physical page (M), and an upper physical page (U), each storing one bit value. It is assumed that the threshold voltage distributions of the target memory cells storing the preset data are as shown in FIG. 3, and the processor 211 may use preset read voltages $V(1)_1$ to $V(1)_7$ in the preset read voltage set V(1) to accurately determine the storage (bit) states (also referred to as bit values) of the target memory cells, i.e., determining the preset bit values of the preset data stored in the memory cells. The different preset bit values stored in the memory cells and determined accordingly are classified into N Gray codes (storage states). Gate voltages in the respective target memory cells may be classified into eight kinds of Gray codes, i.e., "L:1 M:1 U:1", "L:1 M:1 U:0", "L:1 M:0 U:0", "L:1 M:0 U:1", "L:0 M:0 U:1", "L:0 M:0 U:0", "L:0 M:1 U:0", and "L:0 M:1 U:1" (L: the bit value of the lower physical page, M: the bit value of the middle physical page, U: the bit value of the upper physical page) according to the preset read voltages $V(1)_0$ to $V(1)_7$. The eight kinds of Gray codes may also be represented as eight kinds of bit value combinations, i.e., "111", "110", "100", "101", "001", "000", "010", and "011". The bit values in each of the bit value combinations are represented in the order of upper, middle, and lower physical pages. In other words, by respectively applying the read voltages $V(1)_1$ to $V(1)_7$ of the preset read voltage set V(1) having different voltage values to one of the memory cells of the target word line, the processor 211 may determine whether the channel of the memory cell is turned on and thereby respectively determine that the bit value (also referred to as bit data or read bit value) stored in the memory cell correspond to one of the different Gray codes (i.e., "111", "110", "100", "101", "001", "000", "010", and "011"), i.e., identifying the type of the Gray code stored in each of the target memory cells. For example, the read voltage $V(1)_1$ may distinguish between the Gray code "111" and the Gray code "110" (the left of the read voltage $V(1)_1$ is a threshold voltage distribution of memory cells corresponding to the Gray code "111", and the right of the read voltage $V(1)_1$ is a threshold voltage distribution of memory cells corresponding to the Gray code "110"). It should be noted that, as the memory cells in the rewritable non-volatile memory module 220 may have a plural number of Gray codes (8 in the example described herein), the number of the read voltages in each read voltage set is the plural number of Gray codes minus 1 (7 in the example described herein, i.e., N−1=8−1=7).

It should be noted that, according to the type of the rewritable non-volatile memory module 220, N may be a predetermined positive integer greater than 2 (also referred to as the first predeteimined positive integer). For example, if the rewritable non-volatile memory module 220 is an MLC NAND flash memory module, then N=4; if the rewritable non-volatile memory module 220 is an SLC NAND flash memory module, then N=2; and if the rewritable non-volatile memory module 220 is a QLC NAND flash memory module, then N=16.

It should be noted that, in the embodiment, the threshold voltage distributions of the memory cells of the target word line may be deviated from default threshold voltage distributions. Due to the deviation of the threshold voltage distributions, a default read voltage set corresponding to the default threshold voltages is no longer suitable for reading the word line whose threshold voltage distributions are already deviated. The processor 211 needs to additionally find a plurality of more desirable read voltages corresponding to the target word line, such that each of the read voltages may be respectively close to the interface between corresponding two adjacent threshold voltage distributions. The read voltages found accordingly may form a read voltage set serving as an optimized read voltage set of the target word line. Thus, the read bit values obtained through reading the preset data stored in the target memory cells by using the optimized read voltage set may be close to the preset bit values.

Returning to FIG. 2, after Step S23 is completed, the read voltage management circuit unit 215 (or the deviation amount calculation circuit 2151) may be informed of all the storage states included in the preset bit values stored in the target memory cells. In other words, the preset bit values of the preset data stored in the target memory cells may be one or more "111", one or more "110", one or more "100", one or more "101" one or more "001", one or more "000", one or more "010", and one or more "011". The preset bit values of the preset data may be set as fixed bit values in advance by the processor 211. In addition, before performing the read voltage optimization operation, the processor 211 already writes the preset data to the target memory cells of the target word line. For example, the preset data may be written to the target word line in advance when the physical units of the target word line are used to store user data. In other words, without a read operation, the processor 211 (or the read voltage management circuit unit 215) may still be informed of the preset bit values of the preset data stored (programmed) in the target memory cells beforehand, and may also be informed of the Gray codes to which the stored preset bit values belong. Accordingly, the processor 211 may classify the target memory cells into a plurality of target memory cell groups corresponding to different storage states (Gray codes). For example, the preset bit values of the preset data for use may be set in the factory setting and recorded in the read voltage management circuit unit 215. In an embodiment, the preset bit values (and the corresponding target word line) may be set in advance (and recorded) in the firmware or software for operating the processor 211. In another embodiment, the preset data may also be user data stored in the target memory cells, and the user data is successfully decoded data. Thus, the processor 211 (or the read voltage management circuit unit 215) may compare the successfully decoded user data with the user data being read (before decoding) to find out the optimized read voltage set.

Then, at Step S25, the read voltage management circuit unit 215 (or the deviation amount counter circuit 2151) may read the target memory cells by using X different read voltage sets to obtain X read bit value sets corresponding to the X read voltage sets, and may obtain X deviation amount summation sets by comparing the X read bit value sets with the preset bit values, wherein X is a second positive integer. More specifically, the X read voltage sets are ordered based on a first predetermined order, and a voltage difference between every pair of adjacent read voltage sets among the X read voltage sets is a first predetermined voltage difference. In addition, each of the X read voltage sets has N−1 read voltages ordered based on a second predetermined order, and each of the X deviation amount summation sets has N−1 deviation amount summations ordered based on the second predetermined order. Moreover, the $i^{th}$ read bit value set in the X read bit value sets corresponds to the $i^{th}$ read voltage set in the X read voltage sets, the $i^{th}$ deviation amount summation set in the X deviation amount summation sets corresponds to the $i^{th}$ read voltage set in the X read voltage sets, and the $j^{th}$ deviation amount summation in the $i^{th}$ deviation amount summation set corresponds to the $j^{th}$ read voltage in the N−1 read voltages of the read voltage set. In the following, details of the X read voltage sets are described with reference to FIG. 3.

Referring to FIG. 3, in an example, it is assumed that N=8, the first read voltage set V(1) is the first read voltage set (e.g., the preset read voltage set) of the X read voltage sets arranged based on the first predetermined order, and a second read voltage set V(2) is the second read voltage set of the X read voltage sets. In addition, the first read voltage set V(1) has N−1 read voltages ordered based on the second predetermined order, i.e., read voltages $V(1)_1$, $V(1)_2$, $V(1)_3$, $V(1)_4$, $V(1)_5$, $V(1)_6$, and $V(1)_7$, and the second read voltage set V(2) has 7 (i.e., N−1=8−1=7) read voltages, i.e., read voltages $V(2)_1$, $V(2)_2$, $V(2)_3$, $V(2)_4$, $V(2)_5$, $V(2)_6$, and $V(2)_7$. The voltage difference between the pair of adjacent read voltage sets is the first predetermined voltage difference ($V_{offset}$). For example, a voltage difference between the first read voltage $V(2)_1$ of the second read voltage set and the corresponding first read voltage $V(1)_1$ of the first read voltage set is the first predetermined voltage difference ($V_{offset}$). In other words, a difference obtained by subtracting the voltage value of the read voltage $V(1)_1$ from the voltage value of the read voltage V(2), is $V_{offset}$. In other words, for every pair of adjacent read voltage sets among the X read voltage sets, the voltage difference between two read voltages ordered at the same position in the adjacent read voltage sets is the fixed first predetermined voltage difference $V_{offset}$.

In the embodiment, in the operation of reading the target memory cells by respectively using the different X read voltage sets to obtain the X read bit value sets respectively corresponding to the X read voltage sets, the read voltage management circuit unit 215 (or the deviation amount counter circuit 215) may choose the $i^{th}$ read voltage set of the X read voltage sets, wherein the values of i may include 1 to X based on the first predetermined order. Then, the read voltage management circuit unit 215 (or the deviation amount counter circuit 2151) may read the target memory cells by respectively using the N−1 read voltages in the $i^{th}$ read voltage set to obtain a plurality of read bit values classified into the Gray codes and corresponding to the $i^{th}$ read voltage set. The read bit values form the $i^{th}$ read bit value set corresponding to the $i^{th}$ read voltage set in the X read bit value sets. In addition, the $i^{th}$ read voltage in the N−1 read voltages of the $i^{th}$ read voltage set serves to distinguish between the threshold voltage distribution corresponding to the $j^{th}$ Gray code in the N Gray codes and the threshold voltage distribution corresponding to the $(j+1)^{th}$ Gray code in the N Gray codes, wherein j is 1 to N−1 based on the second predetermined order. After obtaining corresponding read bit value sets (and the read bit values corresponding to the target memory cells) through reading the target memory cells by using the X read voltage sets, the read voltage management circuit unit 215 (or the deviation amount counter circuit 215) may identify the read bit values of the target memory cells corresponding to the X read voltage sets according to the X read bit sets.

FIG. 4 is a schematic diagram illustrating calculating deviation amount summations according to an embodiment of the invention. Please refer FIG. 4, the reference "NL1" indicates the amount of memory cells whose storage states of lower physical pages occurring the first deviation; the reference "NM1" indicates the amount of memory cells whose storage states of middle physical pages occurring the first deviation; the reference "NU1" indicates the amount of memory cells whose storage states of upper physical pages occurring the first deviation; the reference "NL2" indicates the amount of memory cells whose storage states of lower physical pages occurring the second deviation; the reference "NM2" indicates the amount of memory cells whose storage states of middle physical pages occurring the second deviation; the reference "NU2" indicates the amount of memory cells whose storage states of upper physical pages occurring the second deviation; the reference "SNL" indicates a summation of deviations of lower physical pages; the reference "SNM" indicates a summation of deviations of middle physical pages; and the reference "SNU" indicates a summation of deviations of upper physical pages.

In the embodiment, in the operation of obtaining the X deviation amount summation sets by comparing the X read bit value sets and the preset bit values, the read voltage management circuit unit 215 (or the deviation amount counter circuit 2151) may perform Steps (1) to (4) as follows.

Step (1): The read voltage management circuit unit 215 (or the deviation amount counter circuit 2151) classifies the target memory cells into N target memory cell groups (e.g., G1 to G8) corresponding to the N Gray codes according to the preset bit values, wherein the N Gray codes are ordered based on a third predetermined order (e.g., 1 to 8).

Specifically, according to the preset bit values, the read voltage management circuit unit 215 (or the deviation amount counter circuit 2151) may classify all the target memory cells into the target memory cell group G1 storing the preset bit values corresponding to the Gray code "111", the target memory cell group G2 storing the preset bit values corresponding to the Gray code "110", the target memory cell group G3 storing the preset bit values corresponding to the Gray code "100", the target memory cell group G4 storing the preset bit values corresponding to the Gray code "101", the target memory cell group G5 storing the preset bit values corresponding to the Gray code "001", the target memory cell group G6 storing the preset bit values corresponding to the Gray code "000", the target memory cell group G7 storing the preset bit values corresponding to the Gray code "010", and the target memory cell group G8 storing the preset bit values corresponding to the Gray code "011".

Step (2): The read voltage management circuit unit 215 (or the deviation amount counter circuit 2151) may choose the $i^{th}$ read bit value set in the X read bit value sets for the $i^{th}$ deviation amount summation set corresponding to the $i^{th}$ read voltage set in the X deviation amount summation sets, wherein the values of i include 1 to X based on the first predetermined order, and the $i^{th}$ read bit value set serves to calculate the $i^{th}$ deviation amount summation set in the X deviation amount summation sets.

Specifically, in order to obtain each deviation amount summation set of the X deviation amount summation sets, such as the $i^{th}$ deviation amount summation set corresponding to the $i^{th}$ read voltage set, the read voltage management circuit unit 215 (or the deviation amount counter circuit 2151) may correspondingly choose the read bit value set and identify the read bit values obtained through reading the target memory cells by using the $i^{th}$ read voltage set according to the read bit value set.

Step (3): The read voltage management circuit unit 215 (or the deviation amount counter circuit 2151) may identify a plurality of first target memory cells classified into the $j^{th}$ target memory cell group in the N target memory cell groups and a plurality of second target memory cells classified into the $(j+1)^{th}$ target memory cell group in the N target memory cell groups for the $j^{th}$ deviation amount summation of the $i^{th}$ deviation amount summation set corresponding to the $i^{th}$ read voltage of the read voltage set. The $j^{th}$ read voltage serves to distinguish between the threshold voltage distribution of the $j^{th}$ target memory cell group corresponding to the $j^{th}$ Gray code in the N Gray codes and the threshold distribution of the $(j+1)^{th}$ target memory cell group corresponding to the $(j+1)^{th}$ Gray code in the N Gray codes.

Specifically, in order to obtain the value of each deviation amount summation of the $j^{th}$ read voltage of the $i^{th}$ read voltage set, i.e., the $j^{th}$ deviation amount summation corresponding to the $j^{th}$ read voltage of the read voltage set, the read voltage management circuit unit 215 (or the deviation amount counter circuit 2151) may identify two target memory cell groups whose Gray codes are distinguished by the $j^{th}$ read voltage and the target memory cells in the two target memory cell groups.

For example, for a case where N=8, i=1, and j=2, i.e., for the second (j=2) deviation amount summation $S(1)_2$ of the first deviation amount summation set corresponding to the second read voltage $V(1)_2$ of the first (i=1) read voltage set V(1), the read voltage management circuit unit 215 (or the deviation amount counter circuit 2151) may firstly identify the first target memory cells of the target memory cell group G2 (i.e., those classified into the second target memory cell group of the eight target memory cell groups) and the second target memory cells of the target memory cell group G3 (i.e., those classified into the third (j+1=3) target memory cell group in the eight target memory cell groups) distinguished by the read voltage $V(1)_2$.

Then, the read voltage management circuit unit 215 (or the deviation amount counter circuit 2151) may perform Step (4). Specifically, the read voltage management circuit unit 215 (or the deviation amount counter circuit 2151) may identify a plurality of first read bit values of the first target memory cells of the $j^{th}$ target memory cell group and a plurality of second read bit values of the second target memory cells of the $(j+1)^{th}$ target memory cell group.

For example, following the above case, the read voltage management circuit unit 215 (or the deviation amount counter circuit 2151) may identify the read bit values (also referred to as the first read bit values) of the first target memory cells of the target memory cell group G2 and the read bit values (also referred to as the second read bit values) of the second target memory cells in the target memory cell group G3.

Then, at Step (5), the read voltage management circuit unit 215 (or the deviation amount counter circuit 2151) may identify the number of a plurality of third read bit values belonging to the $(j+1)^{th}$ Gray code in the first read bit values as a first deviation amount according to the first read bit values, and identify the number of a plurality of fourth read bit values belonging to the $j^{th}$ Gray code in the second read bit values as a second deviation amount according to the second read bit values.

Ideally, the storage states of the first read bit values of the first target memory cells in the target memory cell group G2 should all belong to the second Gray code "110" in the N Gray codes (i.e., the preset storage states/preset read bit values of the first target memory cells should be "110"). If there are the third read bit values, among the first read bit values, whose storage states belong to the third Gray code "100" in the N Gray codes, the number of the third read bit values (the number of the first target memory cells storing the third read bit values) is identified as the first deviation amount indicating the number of the target memory cells showing the first deviation (i.e., the case where the storage state is deviated toward the "right" from the preset storage state, the Gray code "100" is on the right of the Gray code "110") in the first target memory cells. As shown in FIG. 4, the first deviation amount corresponding to the second read voltage of the first read voltage set may be represented as "$C(1)_{G2G3}$", where "(1)" represents the correspondence to the first read voltage set, and "G2G3" indicates the deviation from the preset storage state corresponding to the target memory cell group G2 to the storage state corresponding to the target memory cell group G3. Besides, "G2G3" also indicates that the corresponding read voltage is the second read voltage distinguishing between the storage state of the target memory cell group G2 and the storage state of the target memory cell group G3 in the read voltage set, and the order of "G2" and "G3" in "G2G3" indicates that the direction of deviation is from G2 to G3, i.e., the left-to-right direction of the first deviation.

Similarly, the storage states of the second read bit values of the second target memory cells in the target memory cell group G3 should ideally all belong to the third Gray code "100" in the N Gray codes (i.e., the preset storage states/ preset read bit values of the second target memory cells should all be "100"). If there are fourth read bit values, among the second read bit values, whose storage states belong to the second Gray code "110" in the N Gray codes, the number of the fourth read bit values (the number of the second target memory cells storing the fourth read bit values) is identified as the second deviation amount indicating the number of the target memory cells showing a second deviation (i.e., a case where the storage state is deviated toward the "left" from the preset storage state, the Gray code "110" is on the left of the Gray code "100") in the second target memory cells. As shown in FIG. 4, the second deviation amount corresponding to the second read voltage of the first read voltage set may be represented as "$C(1)_{G3G2}$", where "(1)" represents the correspondence to the first read voltage set, and "G3G2" indicates the deviation from the preset storage state corresponding to the target memory cell group G3 to the storage state corresponding to the target memory cell group G2. Besides, "G3G2" also indicates that the corresponding read voltage is the second read voltage distinguishing between the storage state of the target memory cell group G3 and storage state of the target memory cell group G2 in the read voltage set, and the order of "G3" and "G2" in "G3G2" indicates that the direction of deviation is from G3 to G2, i.e., the right-to-left direction of the second deviation.

Step (6): The read voltage management circuit unit 215 (or the deviation amount counter circuit 2151) calculates a summation of the first deviation amount and the second deviation amount and adopt the summation as the $j^{th}$ deviation amount summation in the N−1 deviation amount summations of the $i^{th}$ deviation amount summation set.

Following the above case, the read voltage management circuit unit 215 (or the deviation amount counter circuit 2151) may sum up the first deviation amount $C(1)_{G2G3}$ and the second deviation amount $C(1)_{G3G2}$ corresponding to the read voltage $V(1)_2$, and adopt the summation obtained accordingly as the second deviation amount summation $S(1)_2$ of the N−1 deviation amount summations in the first deviation amount summation set.

Based on the same principle, the read voltage management circuit unit 215 (or the deviation amount counter circuit 2151) may calculate the first deviation amount summation $S(1)_1$ in the N−1 deviation amount summations of the first deviation amount summation set according to the first deviation amount $C(1)_{G1G2}$ and the second deviation amount $C(1)_{G2G1}$ corresponding to the first read voltage $V(1)_1$ of the first read voltage set, calculate the first deviation amount summation $S(1)_3$ in the N−1 deviation amount summations of the first deviation amount summation set according to the first deviation amount $C(1)_{G3G4}$ and the second deviation amount $C(1)_{G4G3}$ corresponding to the third read voltage $V(1)_3$ of the first read voltage set, calculate the first deviation amount summation $S(1)_4$ in the N−1 deviation amount summations of the first deviation amount summation set according to the first deviation amount $C(1)_{G4G5}$ and the second deviation amount $C(1)_{G5G4}$ corresponding to the fourth read voltage $V(1)_4$ of the first read voltage set, calculate the first deviation amount summation $S(1)_5$ in the N−1 deviation amount summations of the first deviation amount summation set according to the first deviation amount $C(1)_{G5G6}$ and the second deviation amount $C(1)_{G6G5}$ corresponding to the fifth read voltage $V(1)_5$ of the first read voltage set, calculate the first deviation amount summation $S(1)_6$ in the N−1 deviation amount summations of the first deviation amount summation set according to the first deviation amount $C(1)_{G3G7}$ and the second deviation amount $C(1)_{G7G6}$ corresponding to the sixth read voltage $V(1)_6$ of the first read voltage set, and calculate the first deviation amount summation $S(1)_7$ in the N−1 deviation amount summations of the first deviation amount summation set according to the first deviation amount $C(1)_{G7G8}$ and the second deviation amount $C(1)_{G8G7}$ corresponding to the seventh read voltage $V(1)_7$ of the first read voltage set. Accordingly, all of the N−1 deviation amount summations of the first deviation amount summation set are obtained. Following the same steps, the X deviation amount summation sets may also be obtained. Hence, details in this regard will not be repeated in the following.

The first deviation (also referred to as a positive deviation) is in a positive voltage direction (e.g., rightward "→"), and the second deviation (also referred to as a negative direction) is in a negative voltage direction (e.g., leftward "←").

Figure 5:
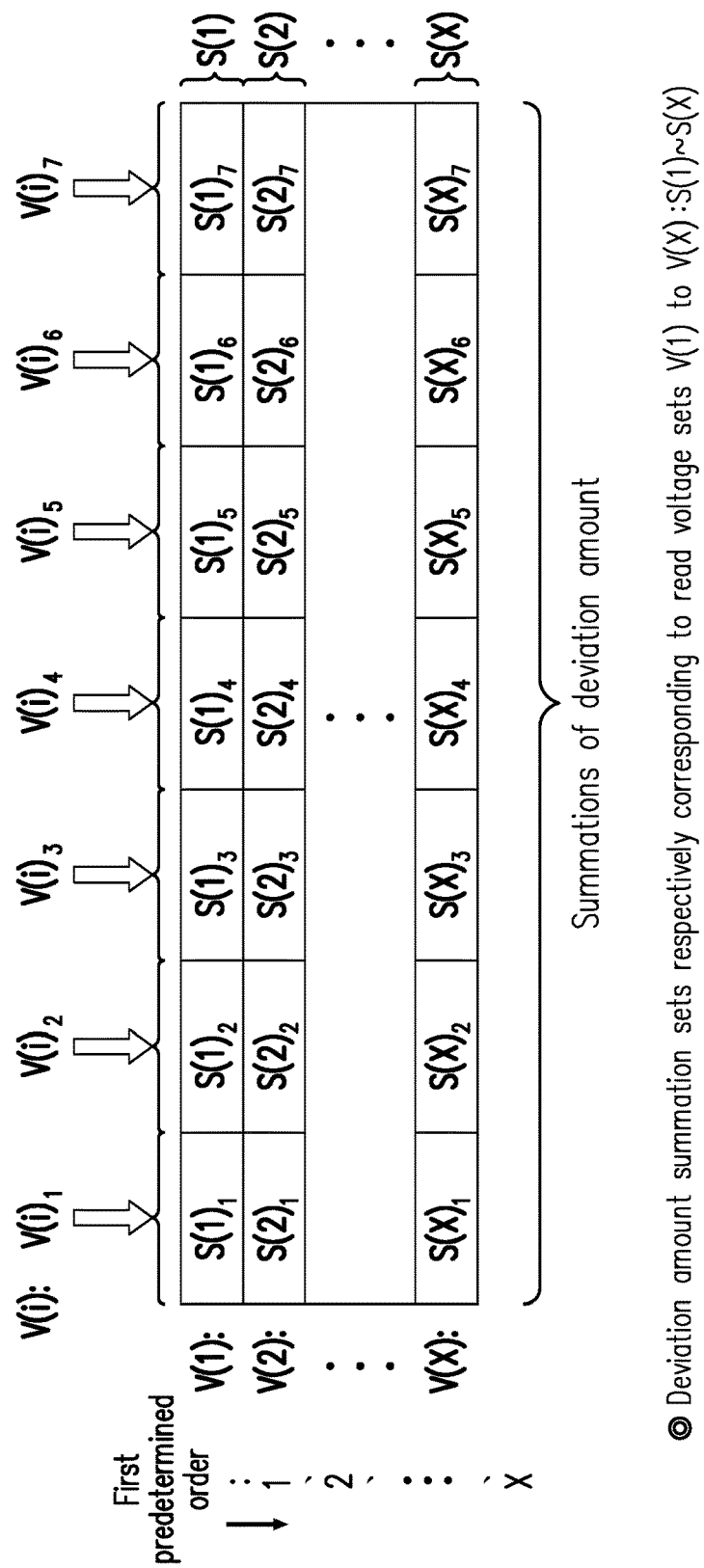
FIG. 5 is a schematic diagram illustrating a statistics table recording the deviation amount summations according to an embodiment of the invention.

FIG. 5 is a schematic diagram illustrating a statistics table recording the deviation amount summations according to an embodiment of the invention. Referring to FIG. 5, in the embodiment, the processor 211 may record the X deviation amount summation sets of the target memory cells in the form of a statistics table 510. Based on the second predetermined order, the first read voltage $V(i)_1$ of the $i^{th}$ read voltage set of the X read voltage sets corresponds to all the first deviation amount summations $S(1)_1$ to $S(X)_1$ of the X deviation amount summation sets, the second read voltage $V(i)_2$ corresponds to all the second deviation amount summations $S(1)_2$ to $S(X)_2$ of the X deviation amount summation sets, the third read voltage $V(i)_3$ corresponds to all the third deviation amount summations $S(1)_3$ to $S(X)_3$ of the X deviation amount summation sets, the fourth read voltage $V(i)_4$ corresponds to all the fourth deviation amount summations $S(1)_4$ to $S(X)_4$ of the X deviation amount summation sets, the fifth read voltage $V(i)_5$ corresponds to all the fifth deviation amount summations $S(1)_5$ to $S(X)_5$ of the X deviation amount summation sets, the sixth read voltage $V(i)_6$ corresponds to all the sixth deviation amount summations $S(1)_6$ to $S(X)_6$ of the X deviation amount summation sets, and the seventh read voltage $V(i)_7$ corresponds to all the seventh deviation amount summations $S(1)_7$ to $S(X)_7$ of the X deviation amount summation sets.

Returning to FIG. 2, after Step S25 is completed, the read voltage management circuit unit 215 (or the read voltage optimization circuit 2152) may determine N−1 optimized read voltages of the optimized read voltage set at Step S27, wherein N is the first predetermined positive integer greater than 2.

Specifically, according to the obtained X deviation amount summation sets, the read voltage management circuit unit 215 (or the read voltage optimization circuit) may identify the X $j^{th}$ deviation amount summations of all the X deviation amount summation sets, and adopt the minimum one of the X $j^{th}$ deviation amount summations as the target $j^{th}$ deviation amount summation, and determine that the read voltage corresponding to the $j^{th}$ deviation amount summation is the $j^{th}$ optimized read voltage in the N−1 optimized read voltages of the optimized read voltage set.

For example, in order to find the first (j=1) optimized read voltage in the N−1 (N=8) optimized read voltages of the optimized read voltage set, the read voltage management circuit unit 215 (or the read voltage optimization circuit 2152) may identify all the first deviation amount summations $S(1)_1$ to $S(X)_1$ in the X deviation amount summation sets, and adopt the minimum of the first deviation amount summations $S(1)_1$ to $S(X)_1$ to be the target first deviation amount summation. Assuming that the minimum one of the first deviation amount summations $S(1)_1$ to $S(X)_1$ is the first deviation amount summation $S(3)_1$ of the third (i=3) deviation amount summation set, the target first deviation amount summation may be determined as the first deviation amount summation $S(3)_1$ of the third deviation amount summation set. Besides, the read voltage management circuit unit 215 (or the read voltage optimization circuit 2152) may determine that the read voltage $V(3)_1$ corresponding to the target first deviation amount summation $S(3)_1$ is the first optimized read voltage in the N−1 optimized read voltages of the optimized read voltage set. Based on the same principle, the read voltage management circuit unit 215 (or the read voltage optimization circuit 2152) may look for all the optimized read voltages (i.e., the first to seventh optimized read voltages) of the optimized read voltage set according to the X deviation amount summation sets.

In an embodiment, if there are more than one minimum in the X $j^{th}$ deviation amount summations, adopting the minimum of the X $j^{th}$ deviation amount summations as the target $j^{th}$ deviation amount summation includes: (1) choosing any one of all the minimums of the X $j^{th}$ deviation amount summations as the target $j^{th}$ deviation amount summation; or (2) choosing the $j^{th}$ deviation amount summation ordered in the middle among all the minimums of the X $j^{th}$ deviation amount summations based on the first predetermined order as the target $j^{th}$ deviation amount summation. For example, if the minimums of the first deviation amount summations $S(1)_1$ to $S(X)_1$ are the first deviation amount summations $S(1)_1$, $S(2)_1$, and $S(3)_1$, the read voltage management circuit unit 215 (or the read voltage optimization circuit 2152) may arbitrarily choose one of the first deviation amount summations $S(1)_1$, $S(2)_1$, and $S(3)_1$ as the target first deviation amount summation ((1) above), or the read voltage management circuit unit 215 (or the read voltage optimization circuit) may choose the middle one of the first deviation amount summations $S(1)_1$, $S(2)_1$, and $S(3)_1$, i.e., the first deviation amount summation $S(2)_1$, as the target first deviation amount summation ((2) above).

In view of the foregoing, in the decoding method and the storage controller according to the embodiments of the invention, the read voltage optimization operation corresponding to the target word line may be performed on the target word line by using the preset data stored in the target word line. In the read voltage optimization operation, the storage controller may calculate the deviation amount summation sets according to the read bit values sets obtained through reading the target word line by using the different read voltage sets, so as to determine the optimized read voltages in the optimized read voltage set corresponding to the target word line according to the deviation amount summation sets. Accordingly, the optimal read voltage set for reading the target word line can be found efficiently and quickly, so as to facilitate the accuracy of the read data and make the decoding for the read operation more efficient.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A decoding method for a storage device comprising a rewritable non-volatile memory module, wherein the rewritable non-volatile memory module comprises a plurality of word lines, each of the word lines comprises a plurality of memory cells, each of the memory cells is programmed to store a bit value corresponding to one of a plurality of different Gray codes, a total number of the Gray codes is N, N is a first predetermined positive integer greater than 2, and the method comprises:

choosing a target word line of the word lines, wherein preset data is programmed to a plurality of target memory cells of the target word line;

identifying a plurality of preset bit values stored in the target memory cells according to the preset data;

reading the target memory cells by using respectively different X read voltage sets to obtain X read bit value sets respectively corresponding to the X read voltage sets, and obtaining X deviation amount summation sets by comparing the X read bit value sets and the preset bit values, wherein X is a second predetermined positive integer, the X read voltage sets are ordered based on a first predetermined order, and a voltage difference between every pair of adjacent read voltage sets among the X read voltage sets is a first predetermined voltage difference, each of the X read voltage sets has N−1 read voltages ordered based on a second predetermined order, and each of the X deviation amount summation sets has N−1 deviation amount summations ordered based on the second predetermined order, wherein an $i^{th}$ read bit value set of the X read bit value sets corresponds to an $i^{th}$ read voltage set of the X read voltage sets, an $i^{th}$ deviation amount summation set of the X deviation amount summation sets corresponds to the $i^{th}$ read voltage set of the X read voltage sets, and a $j^{th}$ deviation amount summation of the $i^{th}$ deviation amount summation set corresponds to a $j^{th}$ read voltage of the N−1 read voltages of the $i^{th}$ read voltage set; and determining N−1 optimized read voltages of an optimized read voltage set according to the X deviation amount summation sets.

2. The decoding method as claimed in claim 1, wherein the step of reading the target memory cells by using respectively the different X read voltage sets to obtain the X read bit value sets respectively corresponding to the X read voltage sets comprises:

choosing the $i^{th}$ read voltage set of the X read voltage sets, wherein values of i comprise 1 to X based on the first predetermined order;

reading the target memory cells by respectively using the N−1 read voltages of the $i^{th}$ read voltage set to obtain a plurality of read bit values corresponding to the $i^{th}$ read voltage set and classified into the Gray codes, wherein the read bit values form an $i^{th}$ read bit value set corresponding to the $i^{th}$ read voltage set in the X read bit value sets, and the $j^{th}$ read voltage of the N−1 read voltages of the $i^{th}$ read voltage set serves to distinguish between a threshold voltage distribution corresponding to a $j^{th}$ Gray code of the N Gray codes and a threshold voltage distribution of a $(j+1)^{th}$ Gray code of the N Gray codes, wherein j is 1 to N−1 based on the second predetermined order.

3. The decoding method as claimed in claim 2, wherein the step of obtaining the X deviation amount summation sets by comparing the X read bit value sets and the preset bit values comprises:

classifying the target memory cells into N target memory cell groups respectively corresponding to the N Gray codes according to the preset bit values, wherein the N Gray codes are ordered based on a third predetermined order;

choosing the $i^{th}$ read bit value set of the X read bit value sets for the $i^{th}$ deviation amount summation set corresponding to the $i^{th}$ read voltage set in the X deviation amount summation sets, wherein values of i comprise 1 to X based on the first predetermined order, and the $i^{th}$ read bit value set serves to calculate the $i^{th}$ deviation amount summation set of the X deviation amount summation sets;

identifying a plurality of first target memory cells classified into a $j^{th}$ target memory cell group of the N target memory cell groups and a plurality of second target memory cells classified into a $(j+1)^{th}$ target memory cell group of the N target memory cell groups for the $j^{th}$ deviation amount summation of the $i^{th}$ deviation amount summation set corresponding to the $j^{th}$ read voltage of the $i^{th}$ read voltage set, wherein the $j^{th}$ read voltage serves to distinguish between a threshold voltage distribution of the $j^{th}$ target memory cell group corresponding to the $j^{th}$ Gray code of the N Gray codes and a threshold voltage distribution of the $(j+1)^{th}$ target memory cell group corresponding to the $(j+1)^{th}$ Gray code of the N Gray codes;

identifying a plurality of first read bit values of the first target memory cells of the $j^{th}$ target memory cell group and a plurality of second read bit values of the second target memory cells of the $(j+1)^{th}$ target memory cell group according to the $i^{th}$ read bit value set;

identifying the number of a plurality of third read bit values belonging to the $(j+1)^{th}$ Gray code in the first read bit values as a first deviation amount according to the first read bit values, and identifying the number of a plurality of fourth read bit values belonging to the $j^{th}$ Gray code in the second read bit values as a second deviation amount according to the second read bit values; and calculating a summation of the first deviation amount and the second deviation amount to adopt the summation as the $j^{th}$ deviation amount summation of the N−1 deviation amount summations of the $i^{th}$ deviation amount summation set.

4. The decoding method as claimed in claim 3, wherein the step of determining the N−1 optimized read voltages of the optimized read voltage set according to the X deviation amount summation sets comprises:

identifying X $j^{th}$ deviation amount summations of all the X deviation amount summation sets and adopting a minimum of the X $j^{th}$ deviation amount summations as a target $j^{th}$ deviation amount summation; and determining that a read voltage corresponding to the target $j^{th}$ deviation amount summation as a $j^{th}$ optimized read voltage of the N−1 optimized read voltages of the optimized read voltage set.

5. The decoding method as claimed in claim 4, wherein if the number of the minimum of the X $j^{th}$ deviation amount summations is greater than 1, the step of adopting the minimum of the X $j^{th}$ deviation amount summations as the target $j^{th}$ deviation amount summation comprises:

choosing any one $j^{th}$ deviation amount summation of all the minimums of the X $j^{th}$ deviation amount summations as the target $j^{th}$ deviation amount summation; or choosing one $j^{th}$ deviation amount summation ordered in the middle among all the minimums of the X $j^{th}$ deviation amount summations based on the first predetermined order as the target $j^{th}$ deviation amount summation.

6. A storage controller, controlling a storage device comprising a rewritable non-volatile memory module, the storage controller comprising:

a connection interface circuit, coupled to a host system;

a memory interface control circuit, coupled to the rewritable non-volatile memory module, wherein the rewritable non-volatile memory module comprises a plurality of word lines, each of the word lines comprises a plurality of memory cells, each of the memory cells is programmed to store a bit value corresponding to one of a plurality of different Gray codes, a total number of the Gray codes is N, and N is a first predetermined positive integer greater than 2;

a read voltage management circuit unit; and a processor, coupled to the connection interface circuit, the memory interface control circuit, and the read voltage management circuit unit, wherein the processor chooses a target word line of the word lines, and instructs the read voltage management circuit unit to perform a read voltage optimization operation corresponding to the target word line, wherein preset data is programmed to a plurality of target memory cells of the target word line, and in the read voltage optimization operation, the read voltage management circuit unit identifies a plurality of preset bit values stored in the target memory cells according to the preset data, the read voltage management circuit unit further reads the target memory cells by using respectively different X read voltage sets to obtain X read bit value sets respectively corresponding to the X read voltage sets, and obtains X deviation amount summation sets by comparing the X read bit value sets and the preset bit values, wherein X is a second predetermined positive integer, the X read voltage sets are ordered based on a first predetermined order, and a voltage difference between every pair of adjacent read voltage sets among the X read voltage sets is a first predetermined voltage difference, each of the X read voltage sets has N−1 read voltages ordered based on a second predetermined order, and each of the X deviation amount summation sets has N−1 deviation amount summations ordered based on the second predetermined order, wherein an $i^{th}$ read bit value set of the X read bit value sets corresponds to an $i^{th}$ read voltage set of the X read voltage sets, an $i^{th}$ deviation amount summation set of the X deviation amount summation sets corresponds to the $i^{th}$ read voltage set of the X read voltage sets, and a $j^{th}$ deviation amount summation of the $i^{th}$ deviation amount summation set corresponds to a $j^{th}$ read voltage of the N−1 read voltages of the $i^{th}$ read voltage set; and the read voltage management circuit unit further determines N−1 optimized read voltages of an optimized read voltage set according to the X deviation amount summation sets.

7. The storage controller as claimed in claim 6, wherein in the operation of reading the target memory cells by using the respectively different X read voltage sets to obtain the X read bit value sets respectively corresponding to the X read voltage sets, the read voltage management circuit unit chooses the $i^{th}$ read voltage set of the X read voltage sets, wherein values of i comprise 1 to X based on the first predetermined order, and the read voltage management circuit unit reads the target memory cells by respectively using the N−1 read voltages of the $i^{th}$ read voltage set to obtain a plurality of read bit values corresponding to the $i^{th}$ read voltage set and classified into the Gray codes, wherein the read bit values form an $i^{th}$ read bit value set corresponding to the $i^{th}$ read voltage set in the X read bit value sets, and the $j^{th}$ read voltage of the N−1 read voltages of the $i^{th}$ read voltage set serves to distinguish between a threshold voltage distribution corresponding to a $j^{th}$ Gray code of the N Gray codes and a threshold voltage distribution of a $(j+1)^{th}$ Gray code of the N Gray codes, wherein j is 1 to N−1 based on the second predetermined order.

8. The storage controller as claimed in claim 7, wherein in the operation of obtaining the X deviation amount summation sets by comparing the X read bit value sets and the preset bit values, the read voltage management circuit unit classifies the target memory cells into N target memory cell groups respectively corresponding to the N Gray codes according to the preset bit values, wherein the N Gray codes are ordered based on a third predetermined order, the read voltage management circuit unit chooses the $i^{th}$ read bit value set of the X read bit value sets for the deviation amount summation set corresponding to the $i^{th}$ read voltage set in the X deviation amount summation sets, wherein values of i comprise 1 to X based on the first predetermined order, and the $i^{th}$ read bit value set serves to calculate the $i^{th}$ deviation amount summation set of the X deviation amount summation sets, the read voltage management circuit unit identifies a plurality of first target memory cells classified into a $j^{th}$ target memory cell group of the N target memory cell groups and a plurality of second target memory cells classified into a $(j+1)^{th}$ target memory cell group of the N target memory cell groups for the $j^{th}$ deviation amount summation of the $i^{th}$ deviation amount summation set corresponding to the $j^{th}$ read voltage of the $i^{th}$ read voltage set, wherein the $j^{th}$ read voltage serves to distinguish between a threshold voltage distribution of the $j^{th}$ target memory cell group corresponding to the $j^{th}$ Gray code of the N Gray codes and a threshold voltage distribution of the $(j+1)^{th}$ target memory cell group corresponding to the $(j+1)^{th}$ Gray code of the N Gray codes, the read voltage management circuit unit identifies a plurality of first read bit values of the first target memory cells of the $j^{th}$ target memory cell group and a plurality of second read bit values of the second target memory cells of the $(j+1)^{th}$ target memory cell group according to the $i^{th}$ read bit value set, the read voltage management circuit unit identifies the number of a plurality of third read bit values belonging to the $(j+1)^{th}$ Gray code in the first read bit values as a first deviation amount according to the first read bit values, and identifying the number of a plurality of fourth read bit values belonging to the $j^{th}$ Gray code in the second read bit values as a second deviation amount according to the second read bit values, the read voltage management circuit unit calculates a summation of the first deviation amount and the second deviation amount to adopt the summation as the $j^{th}$ deviation amount summation of the N−1 deviation amount summations of the $i^{th}$ deviation amount summation set.

9. The storage controller as claimed in claim 8, wherein in the operation of determining the N−1 optimized read voltages of the optimized read voltage set according to the X deviation amount summation sets, the read voltage management circuit unit identifies X $j^{th}$ deviation amount summations of all the X deviation amount summation sets and adopting a minimum of the X $j^{th}$ deviation amount summations as a target $j^{th}$ deviation amount summation, and the read voltage management circuit unit determines a read voltage corresponding to the target $j^{th}$ deviation amount summation as a $j^{th}$ optimized read voltage of the N−1 optimized read voltages of the optimized read voltage set.

10. The storage controller as claimed in claim 9, wherein if the number of the minimum of the X $j^{th}$ deviation amount summations is greater than 1, in the operation of adopting the minimum of the X $j^{th}$ deviation amount summations as the target $j^{th}$ deviation amount summation, the read voltage management circuit unit chooses any one $j^{th}$ deviation amount summation of all the minimums of the X $j^{th}$ deviation amount summations as the target $j^{th}$ deviation amount summation, or the read voltage management circuit unit chooses one $j^{th}$ deviation amount summation ordered in the middle among all the minimums of the X $j^{th}$ deviation amount summations based on the first predetermined order as the target $j^{th}$ deviation amount summation.

* * * * *